United States Patent [19]
Gore et al.

[11] Patent Number: 5,812,043
[45] Date of Patent: Sep. 22, 1998

[54] SHORT SUPERCONDUCTING ANNULAR MRI ELECTRO-MAGNET

[75] Inventors: Russell Peter Gore, Abingdon; Francis John Davies, Kidlington, both of United Kingdom

[73] Assignee: Oxford Magnet Technology Limited, Eynsham, England

[21] Appl. No.: 626,403

[22] Filed: Apr. 2, 1996

[30] Foreign Application Priority Data

Apr. 7, 1995 [GB] United Kingdom .................... 9507212

[51] Int. Cl.⁶ ................................ G01V 3/00; H01F 6/06
[52] U.S. Cl. ........................... 335/216; 324/319; 335/299
[58] Field of Search ..................... 335/216, 299, 335/300, 301; 324/318, 319, 320

[56] References Cited

U.S. PATENT DOCUMENTS

| | | | |
|---|---|---|---|
| 3,559,126 | 1/1971 | Drautman, Jr. .......................... | 335/216 |
| 5,111,172 | 5/1992 | Laskaris .................................... | 335/216 |
| 5,220,800 | 6/1993 | Muller et al. ............................. | 62/51.3 |
| 5,289,128 | 2/1994 | DeMeester et al. ..................... | 324/318 |
| 5,359,310 | 10/1994 | Pissanetzky ............................. | 335/301 |
| 5,463,364 | 10/1995 | Muller ..................................... | 335/299 |
| 5,554,929 | 9/1996 | Doty et al. ............................... | 324/318 |

FOREIGN PATENT DOCUMENTS 2275538  8/1994  United Kingdom .

*Primary Examiner*—Renee S. Luebke
*Assistant Examiner*—Raymond Barrera
*Attorney, Agent, or Firm*—Evenson, McKeown, Edwards & Lenahan, PLLC

[57] ABSTRACT

A superconducting annular electro-magnet for MRI purposes includes an annular winding within which a generally cylindrical space is provided. The winding adjacent each end of the space is formed with a chamfer to provide flaring at each end of the space.

5 Claims, 2 Drawing Sheets

SHORT SUPERCONDUCTING ANNULAR MRI ELECTRO-MAGNET

BACKGROUND OF THE INVENTION

1. Field of the Invention

This invention relates to annular superconducting electro-magnets for use in magnetic resonance imaging (MRI) apparatus.

2. Description of Related Art

Such electro-magnets comprise annular windings which are immersed in liquid helium to produce the low temperatures necessary for superconductivity. Such annular electro-magnets afford a cylindrical space within which a patient is positioned, the space including a predetermined substantially spherical volume, hereinafter referred to as the imaging volume, of high homogeneity magnetic field produced by current in the annular windings.

One of the problems with known electro-magnet arrangements is that in order to provide a desirable degree of magnet field homogeneity and magnetic field strength in the imaging volume, annular electro-magnets having a comparatively long axial length are necessary. One consequence of this is that patients positioned therein tend to suffer from claustrophobia.

SUMMARY OF THE INVENTION

It is an object of the present invention, to provide an electro-magnet which facilitates the provision of MRI apparatus wherein the tendency to produce claustrophobia is reduced.

According to the present invention, a superconducting annular electro-magnet for MRI purposes comprises an annular winding within which a generally cylindrical space is provided, the winding adjacent each end of the space being formed with a chamfer to provide flaring at each end of the said space.

By providing flaring at each end of the space wherein the patient is positioned, an impression of reduced axial length of the space is conveyed to the patient, and consequently a feeling of reduced enclosure, which is effective to reduce claustrophobia.

The winding may comprise a plurality of annular coils disposed symmetrically along a common longitudinal axis, which coils include two similar annular end coils positioned one at each end of the said space, which end coils are each formed with a chamfer to facilitate provision of the said flaring.

Each of the end coils may be fabricated, without the need for a former, by being wound on a suitably shaped mandrel, thereby to form the chamfers and thereafter by being impregnated with a suitable impregnant such as epoxy resin which is cured so that it solidifies prior to the end coil being removed from the mandrel.

The winding is in use contained in a vessel filled with liquid helium, the vessel being contained in a vacuum chamber with at least one heat shield positioned in the chamber between the vessel and an outer wall of the chamber.

The magnet may form a part of MRI apparatus which includes gradient coils and RF coils as required for imaging.

BRIEF DESCRIPTION OF THE DRAWINGS

One embodiment of the invention will now be described by way of example only with reference to the accompanying drawings, wherein;

FIG. 1 is a generally schematic sectional side view of MRI apparatus, including an annular superconducting electro-magnet, and wherein.

DESCRIPTION OF THE PREFERRED EMBODIMENT

Figure 1:
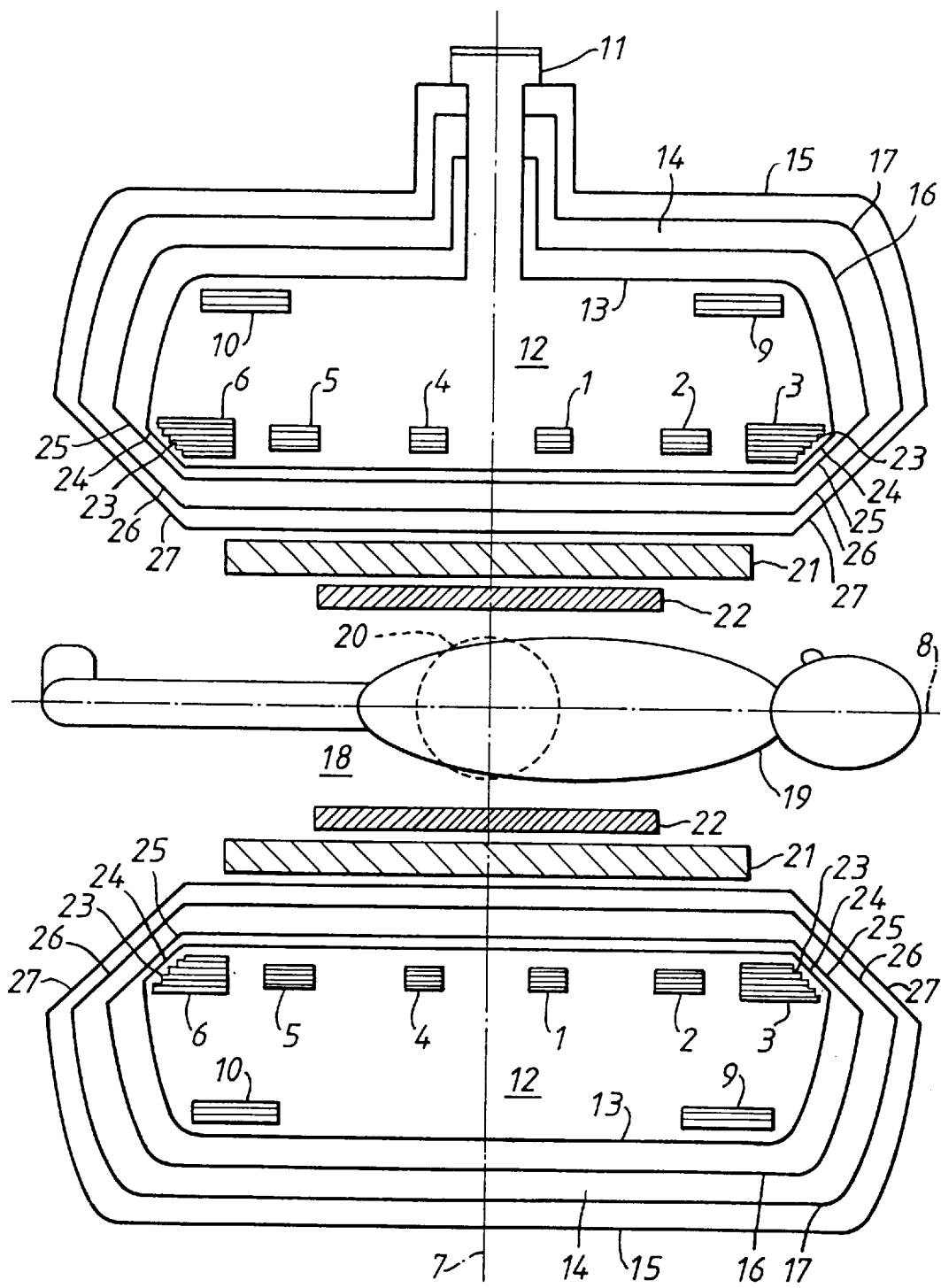

Referring now to FIG. 1, the apparatus comprises an electro-magnet winding defined by coils 1 to 6, which are serially connected to carry a magnetising current. The coils 1 to 6 are symmetrically disposed about a central vertical axis 7 and a longitudinal axis 8 which is common to the coils 1 to 6. In order to provide shielding from the magnetic field produced when the coils 1 to 6 are energised, shielding coils 9 and 10 are provided which are serially connected with the coils 1 to 6 and arranged to produce a field which substantially cancels the magnetic field produced by the coils 1 to 6 outside the assembly. Electrical connection to the coils just before described, is effected in a known manner via a service turret 11, which is arranged to communicate with the interior of a helium vessel 12 having an outer wall 13. The helium vessel 12 is filled with liquid helium via the service turret 11, whereby the coils 1 to 6 and 9, 10 contained therein are maintained at a temperature of about 4K necessary to produce superconductivity. In order to reduce heat gain by the liquid helium, the vessel 12 is contained in a vacuum chamber 14 having an outer wall 15. Between the outer wall 15 of the vacuum chamber and the wall 13 of the helium vessel, two heat shields 16 and 17 are provided which are fabricated from aluminium and which serve to reduce heat gain by radiation.

A cylindrical space 18 is provided within the apparatus, within which space 18 a patient 19 is positioned so that a portion of the patient to be examined lies within a spherical imaging volume 20, wherein the magnetic field is highly homogeneous. In order to provide for magnetic resonance imaging, gradient coils 21 and RF coils 22 are provided. Operation of the gradient coils and RF coils is well understood by those skilled in the art and so details of the imaging process, which is not central to the present invention, will not herein be described.

As hereinbefore explained, one of the problems with MRI apparatus is that in order to produce a desirable degree of magnetic field linearity within the imaging volume 20, magnets having a relatively long longitudinal axial length are required which tend to produce claustrophobia in patients, due to the degree of enclosure. In the present arrangement, in order to reduce the possibility of claustrophobia, the coils 3 and 6 which constitute end coils, are shaped to provide chamfers 23 and those portions 24, 25, 26 and 27 of the vessel 13, the shields 16 and 17 and the vacuum chamber outer wall 15 respectively, which are adjacent the chamfer 23, are chamfered correspondingly to provide flaring at each end of the space 18. The provision of this flaring affords to the patient 19 a feeling of reduced enclosure and accordingly provides for a reduced tendency to claustrophobia. Various modifications may be made to the arrangement shown and for example, in alternative arrangements different chamfer angles and shapes may be provided.

In order to fabricate the coils 3 and 6, they may be wound on a suitably shaped mandrel, thereby to form the chamfers 23, and thereafter impregnated with an epoxy resin impregnant which is cured so that its solidifies prior to the coil being removed from the mandrel.

Figure 2:
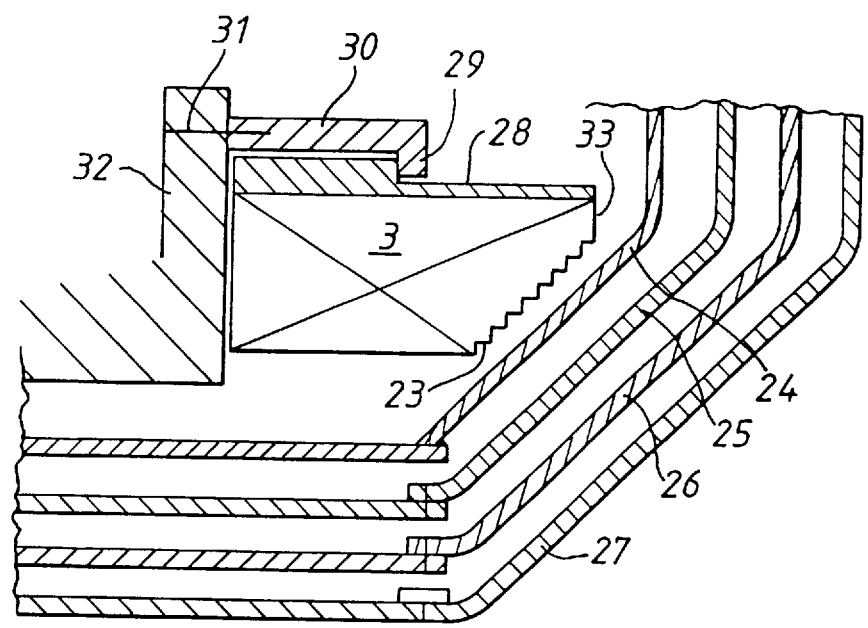
FIG. 2 is a somewhat schematic sectional side view showing in greater detail a part of the apparatus shown in FIG. 1.

As shown in FIG. 2, wherein parts corresponding to FIG. 1 bear the same numerical designations, the coil 3 may be provided with an outer layer 28, of impregnated glass beads or glass fibre, in which a step 29 is formed, which serves to facilitate fixing by means of 'L-shaped' clamps 30 (only one of which is shown), which are held in place by means of screw threaded bolts 31. In order securely to clamp the coils, a single clamp may be used or several clamps may be used, as in this embodiment, spaced equi-angularly around the outer cylindrical surface of the coil and engaging the step. The bolts 31 are arranged to pass through an aluminium support structure 32 on which the coils 1 to 6 and 9, 10 are mounted. By providing this kind of fixing, the need for a clamp which embraces an end portion 33 of the coil 3 so as to extend its axial length, is obviated. This is particularly advantageous because it facilitates a reduction in the overall axial magnet length which in turn facilitates the provision of apparatus wherein the tendency to produce claustrophobia in patients is reduced.

We claim:

1. A short superconducting annular MRI electro-magnet comprising:

a cylindrical bore containing an imaging volume at its center, an annular winding including a plurality of coils, each of the coils being placed around and coaxial with the cylindrical bore, each of a pair of said coils adjacent ends of the cylindrical bore being formed with a chamfer on its inside surface, furthest from the imaging volume, to provide a flared opening to the cylindrical bore and being of formerless construction, and an impregnant gluing turns of said pair of said coils together so that adjacent turns support each other.

2. A short superconducting annular MRI electro-magnet as claimed in claim 1, wherein the winding is in use contained in a vessel filled with liquid helium, the vessel being contained in a vacuum chamber with at least one heat shield positioned in the chamber between the vessel and an outer wall of the chamber.

3. MRI apparatus including a short superconducting annular MRI electro-magnet as claimed in claim 1, wherein the magnet forms a part of the said MRI apparatus, which apparatus includes gradient coils and RF coils as required for imaging.

4. A short superconducting annular MRI electro-magnet as claimed in claim 1, wherein each end coil adjacent the ends of the cylindrical bore is fabricated by being wound on a suitably shaped mandrel, thereby to form the chamfers, and thereafter by being impregnated with said impregnant which is solidified prior to the end coil being removed from the mandrel.

5. A short superconducting annular MRI electro-magnet as claimed in claim 4, wherein the impregnant is an epoxy resin which is cured so that it solidifies before the end coil is removed from the mandrel.

* * * * *